United States Patent
Shank et al.

(10) Patent No.: US 9,953,831 B1
(45) Date of Patent: Apr. 24, 2018

(54) DEVICE STRUCTURES WITH MULTIPLE NITRIDED LAYERS

(71) Applicant: GLOBALFOUNDRIES Inc., Grand Cayman (KY)

(72) Inventors: Steven Shank, Jericho, VT (US); Randall Brault, Essex Junction, VT (US); Jay Burnham, Franklin, VT (US); John J. Ellis-Monaghan, Grand Isle, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/385,949

(22) Filed: Dec. 21, 2016

(51) Int. Cl.
*H01L 27/01* (2006.01)
*H01L 21/02* (2006.01)
*H01L 29/06* (2006.01)
*H01L 27/12* (2006.01)
*H01L 21/762* (2006.01)

(52) U.S. Cl.
CPC .. *H01L 21/02332* (2013.01); *H01L 21/02362* (2013.01); *H01L 21/7624* (2013.01); *H01L 27/1203* (2013.01); *H01L 29/0649* (2013.01)

(58) Field of Classification Search
CPC .......... H01L 27/1203–27/1211; H01L 21/7624–21/76291; H01L 21/02329; H01L 21/02332; H01L 21/02362; H01L 21/8238–21/823892

USPC .......................................................... 257/347
See application file for complete search history.

(56) References Cited

U.S. PATENT DOCUMENTS

| | | | | |
|---|---|---|---|---|
| 5,468,657 A * | 11/1995 | Hsu | ................... | H01L 21/76243 257/E21.339 |
| 6,632,747 B2 | 10/2003 | Niimi et al. | | |
| 7,473,614 B2 * | 1/2009 | Tolchinsky | ....... | H01L 21/76243 257/E21.32 |
| 7,759,260 B2 | 7/2010 | Burnham et al. | | |
| 8,288,826 B2 | 10/2012 | Chou et al. | | |
| 2013/0087856 A1 * | 4/2013 | Ortolland | .......... | H01L 21/28088 257/365 |
| 2014/0084387 A1 * | 3/2014 | Dewey | ................ | H01L 29/0665 257/410 |
| 2014/0183651 A1 * | 7/2014 | Lee | ................. | H01L 21/823857 257/369 |
| 2014/0183653 A1 * | 7/2014 | Niimi | .................... | H01L 29/517 257/369 |

* cited by examiner

*Primary Examiner* — Kevin M Picardat
(74) *Attorney, Agent, or Firm* — Thompson Hine LLP; Anthony Canale

(57) ABSTRACT

Device structures for field-effect transistors and methods of forming device structures for a field-effect transistor. A first dielectric layer is formed on a semiconductor layer and nitrided. A nitrogen-enriched layer is formed at a first interface between the first dielectric layer and the semiconductor layer. Another nitrogen-enriched layer is formed at a second interface between the semiconductor layer and a second dielectric layer. Device structures may include field-effect transistors that include one, both, and/or neither of the nitrogen-enriched layers.

18 Claims, 4 Drawing Sheets

DEVICE STRUCTURES WITH MULTIPLE NITRIDED LAYERS

BACKGROUND

The invention relates generally to integrated circuits and, in particular, to device structures for field-effect transistors and methods of forming device structures for a field-effect transistor.

Complementary-metal-oxide-semiconductor (CMOS) processes may be used to build a combination of p-type field-effect transistors (PFETs) and n-type field-effect transistors (NFETs) that are coupled to implement logic gates and other types of integrated circuits, such as switches. Field-effect transistors generally include an active semiconductor region, a source and a drain defined in the active semiconductor region, and a gate electrode associated with a channel in the active semiconductor region. When a control voltage exceeding a designated threshold voltage is applied to the gate electrode, carrier flow occurs in an inversion or depletion layer in the channel between the source and drain to produce a device output current.

Silicon-on-insulator (SOI) substrates may be advantageous in CMOS processes. In comparison with field-effect transistors built using a bulk silicon wafer, an SOI substrate permits transistor operation at significantly higher speeds with improved electrical isolation and reduced electrical losses. Contingent on the thickness of the device layer of the SOI substrate, a field-effect transistor may operate in a partially-depleted mode in which the depletion layer in the channel in the device layer does not extend fully to the buried oxide layer when typical control voltages are applied to the gate electrode.

Improved device structures for field-effect transistors and methods of forming device structures for a field-effect transistor are needed.

SUMMARY

In an embodiment of the invention, a method includes forming a first dielectric layer on a semiconductor layer, nitriding the first dielectric layer, forming a first nitrogen-enriched layer at a first interface between the first dielectric layer and the semiconductor layer, and forming a second nitrogen-enriched layer at a second interface between the semiconductor layer and a second dielectric layer.

In an embodiment of the invention, a method includes forming a dielectric layer on a semiconductor layer in a first body region and a second body region separated from the first device region by a trench isolation region, and forming a nitrogen-enriched layer at an interface between the dielectric layer and the semiconductor layer in the first device region and between the first dielectric layer and the semiconductor layer in the second device region. After the first nitrogen-enriched layer is formed, the dielectric layer and the nitrogen-enriched layer are removed from the semiconductor layer in the second body region.

In an embodiment of the invention, a structure includes a semiconductor layer having a first body region and a second body region, a trench isolation region separating the first body region of the semiconductor layer from the second body region of the semiconductor layer, a first field-effect transistor including a first dielectric layer formed on the semiconductor layer in the first body region, a second field-effect transistor including a second dielectric layer formed on the semiconductor layer in the second body region, and a nitrogen-enriched layer at a first interface between the first dielectric layer and the semiconductor layer in the first body region. The nitrogen-enriched layer is absent between the second dielectric layer and the semiconductor layer in the second body region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
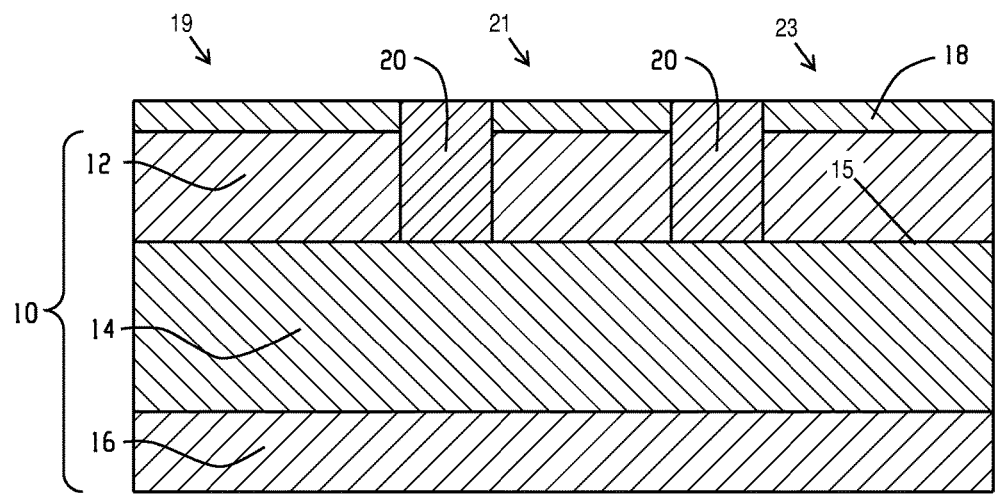
FIGS. 1-5 are cross-sectional views of a portion of a substrate at successive stages of a fabrication process in accordance with embodiments of the invention.

With reference to FIG. 1 and in accordance with an embodiment of the invention, a substrate 10 in the representative form of a silicon-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 and BOX layer 14 terminate at the rim of the handle wafer 16. The device layer 12 is separated from the handle wafer 16 by the intervening BOX layer 14 and is considerably thinner than the handle wafer 16. The device layer 12 is electrically isolated from the handle wafer 16 by the BOX layer 14. The device layer 12 and the handle wafer 16 may be comprised of a single crystal semiconductor material, such as silicon. The BOX layer 14 has a surface in direct contact with the device layer 12 along an interface 15 and another surface in direct contact with the handle wafer 16 along another interface, and these surfaces are separated by the thickness of the BOX layer 14. The handle wafer 16 may be lightly doped to have, for example, p-type conductivity.

A screen oxide layer 18 is formed on the top surface of the device layer 12. The screen oxide layer 18 protects the top surface of the device layer 12 during the implantation of p-wells and n-wells in the device layer 12. Trench isolation regions 20 are formed in the device layer 12, and divide the device layer 12 into body regions 19, 21, 23. The trench isolation regions 20 may be formed by depositing a dielectric material to fill the trenches and planarizing the dielectric material relative to the top surface of the screen oxide layer 18 using, for example, chemical-mechanical polishing (CMP). The dielectric material comprising the trench isolation regions 20 may be an electrical insulator, such as an oxide of silicon (e.g., silicon dioxide ($SiO_2$)), deposited by chemical vapor deposition (CVD).

Figure 2:
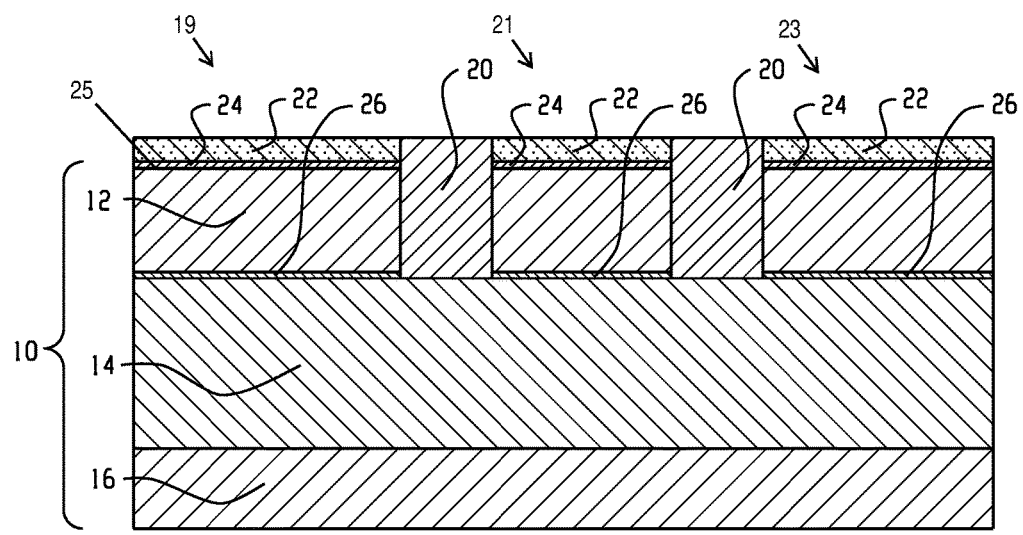

With reference to FIG. 2 in which like reference numerals refer to like features in FIG. 1 and at a subsequent fabrication stage, the screen oxide layer 18 may be stripped after the p-wells and n-wells (not shown) are implanted in the device layer 12. A base dielectric layer 22 is formed on the top surface of the device layer 12 in all of the body regions 19, 21, 23. The base dielectric layer 22 may be constituted by a dielectric material, such as silicon dioxide ($SiO_2$), that is grown by oxidizing the top surface of device layer 12 or deposited by CVD. The base dielectric layer 22 contacts the body regions 19, 21, 23 of the device layer 12 along an interface 25.

The base dielectric layer 22 is nitrided to add a nitrogen content to the constituent dielectric material across its thickness by a nitridation process. Nitrogen may be non-uniformly distributed across the bulk of the base dielectric layer 22, and the nitrided base dielectric layer 22 may include nitrogen-enriched layers 24, 26 that contain a higher peak concentration of nitrogen that the remainder of the bulk of the base dielectric layer 22. The nitrogen-enriched layer 24 of higher peak nitrogen concentration is formed at the interface 25 between the base dielectric layer 22 and the device layer 12 due to nitrogen accumulation, during diffusion, at the interface 25. The nitrogen-enriched layer 26 of higher peak nitrogen concentration is formed at the interface 15 between the device layer 12 and the BOX layer 14 due to nitrogen accumulation, during diffusion, at the interface 15. The nitrogen-enriched layer 24 may be located in total or in part in the base dielectric layer 22 at the interface 25 and/or in total or in part in the device layer 12 at the interface 25. The nitrogen-enriched layer 26 may be located in total or in part in the device layer 12 at the interface 15 and/or in total or in part in the BOX layer 14 at the interface 15.

The nitrogen-enriched layers 24, 26 may be formed by placing the substrate 10 in an atmosphere that includes a nitrogen-rich source gas (e.g., ammonia ($NH_3$)) and heating to a temperature (e.g., 855° C. to 1150° C.) sufficient to cause nitrogen from the nitrogen-rich source gas to be introduced into the base dielectric layer 22 and to diffuse. The nitrogen-enriched layer 26 is formed by nitrogen diffusion through the device layer 12 to the interface with the BOX layer 14. Diffusing nitrogen has a tendency to collect at the interfaces 15, 25 between dielectric and semiconductor materials, which leads to the formation of the nitrogen-enriched layers 24, 26 characterized by a higher peak concentration of nitrogen. An oxidation process at a temperature of, for example, 900° C. may follow the nitridation process in order to reduce traps in the nitrogen-enriched layers 24, 26 and thereby improve their dielectric properties.

Figure 3:
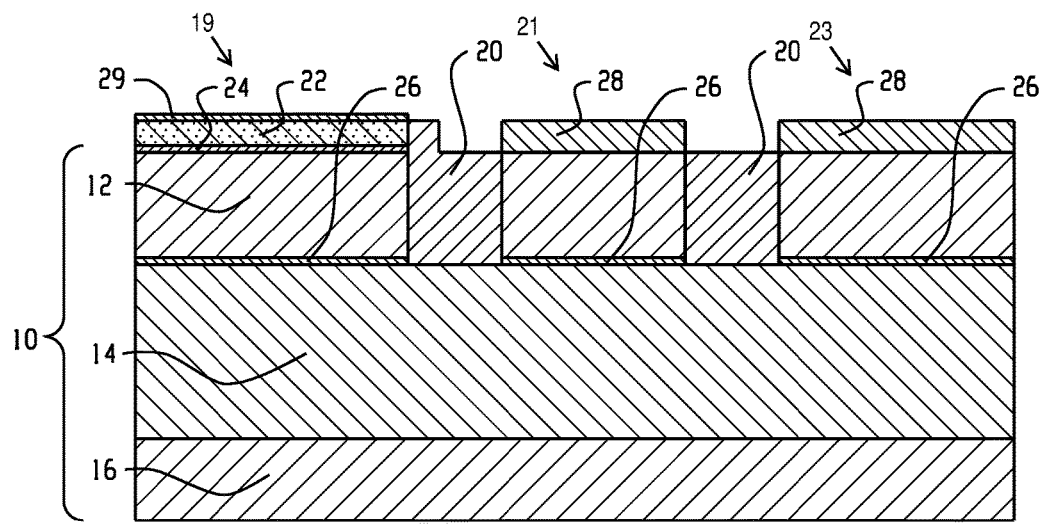

With reference to FIG. 3 in which like reference numerals refer to like features in FIG. 2 and at a subsequent fabrication stage, the base dielectric layer 22 and the nitrogen-enriched layer 24 are removed from the device layer 12 in body region 21 and body region 23. A photoresist layer (not shown) may be applied, lithographically patterned, and then used as an etch mask for an isotropic etch using, for example, a wet chemical solution containing hydrofluoric acid (HF), that removes the dielectric materials of the base dielectric layer 22 and the nitrogen-enriched layer 24 in body regions 21 and 23 selective to the semiconductor material of the device layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. The nitrogen-enriched layer 26 associated with body region 21 and the nitrogen-enriched layer 26 associated with body region 23 are retained. The base dielectric layer 22 and the nitrogen-enriched layer 24, as well as nitrogen-enriched layer 26, associated with body region 19 are also retained.

A dielectric layer 28 is formed on the top surface of the device layer 12 in body region 21 and in body region 23 from which the base dielectric layer 22 was removed. The dielectric layer 28 may be constituted by a dielectric material, such as silicon dioxide ($SiO_2$) deposited by CVD. A section 29 of the dielectric material constituting dielectric layer 28 may also be formed on the top surface of the base dielectric layer 22 in body region 19. An oxidation process at a temperature of, for example, 900° C. may follow in order to improve the dielectric properties of the dielectric layer 28.

Figure 4:
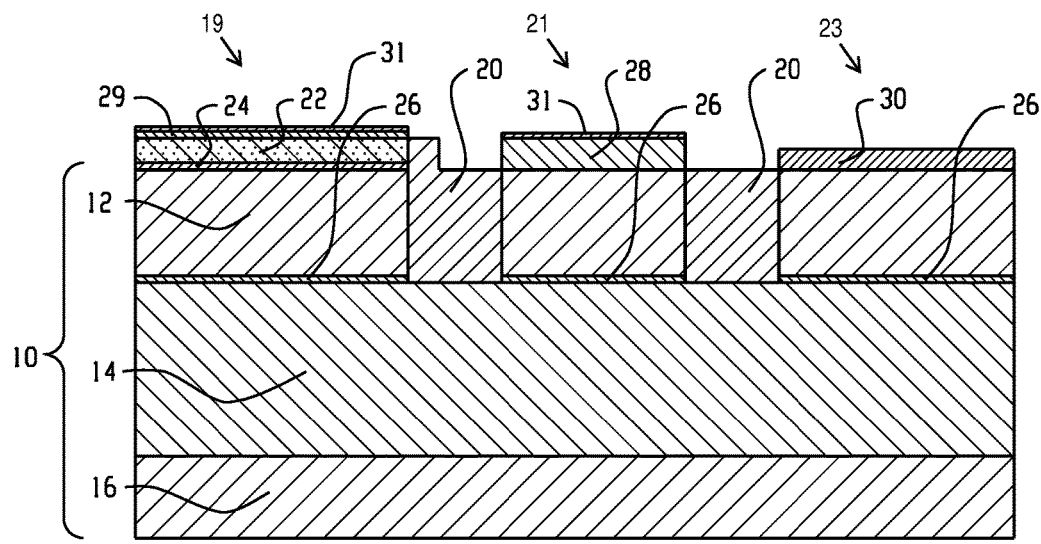

With reference to FIG. 4 in which like reference numerals refer to like features in FIG. 3 and at a subsequent fabrication stage, the dielectric layer 28 is removed from the device layer 12 in body region 23. The base dielectric layer 28 is retained on the device layer 12 in body region 21 and the section 29 of dielectric material is retained in body region 19. A photoresist layer (not shown) may be applied, lithographically patterned, and then used as an etch mask for an isotropic etch using, for example, a wet chemical solution containing hydrofluoric acid (HF), that removes the dielectric material of the dielectric layer 28 in body region 23 selective to the semiconductor material of the device layer 12.

A dielectric layer 30 is formed on the top surface of the device layer 12 in body region 23 from which the dielectric layer 28 was removed. The dielectric layer 30 may be constituted by an electrical insulator, such as silicon dioxide ($SiO_2$), deposited by CVD. In an embodiment, the dielectric layers 28, 30 may be constituted by the same dielectric material, and the dielectric layer 30 may have a thickness that is less than the thickness of the dielectric layer 28. Sections 31 of the dielectric layer 30 may also form on the top surface of the dielectric layer 28 in body region 21, and on the top surface of the base dielectric layer 22 in body region 19. An oxidation process at a temperature of, for example, 900° C. may follow in order to improve the dielectric properties of the dielectric layer 30.

Figure 5:
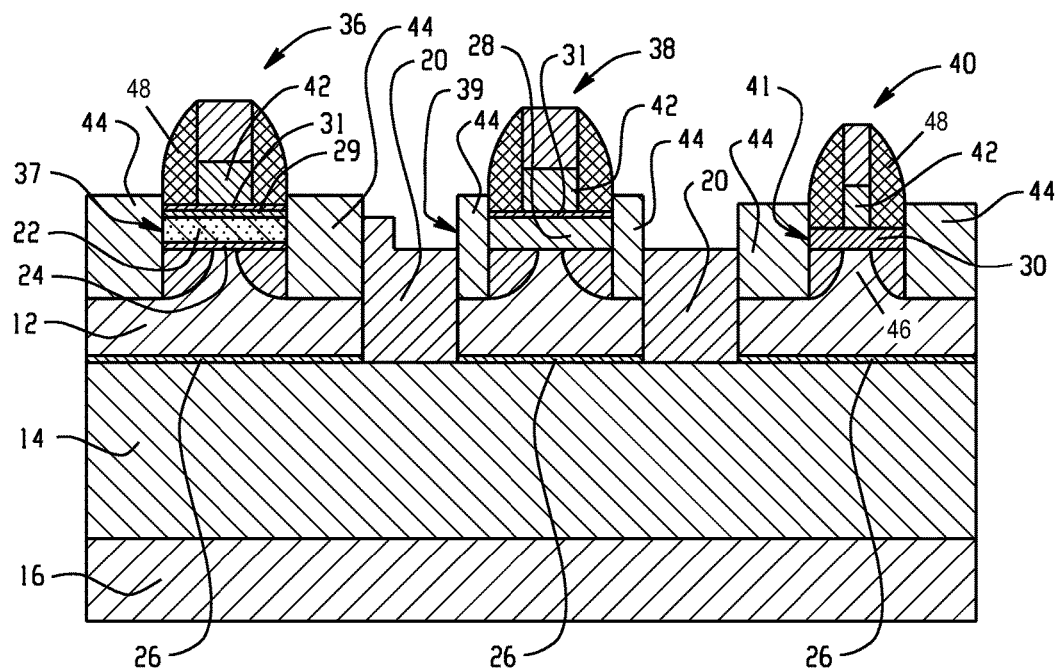

With reference to FIG. 5 in which like reference numerals refer to like features in FIG. 4 and at a subsequent fabrication stage, device structures 36, 38, 40 may be respectively formed in the different body regions 19, 21, 23 using the associated sections of the device layer 12 as semiconductor bodies. The device structures 36, 38, 40 may be field-effect transistors that include a gate electrode 42 and heavily-doped raised source/drain regions 44 formed in the semiconductor body adjacent to the gate electrode 42. The source/drain regions 44 are separated by a well region 46 defining a channel in each semiconductor body and located beneath the gate electrode 42. The semiconductor material constituting the well region 46 may be doped to have a conductivity type opposite to the conductivity type of the semiconductor material contained in the source/drain regions 44.

The gate electrodes 42 are constituted by a conductor, such as a metal, doped polysilicon, a metal silicide, or a layered stack of these and other conductive materials. The source/drain regions 44 may be formed in a self-aligned manner by implantation or diffusion of a suitable dopant, such as a Group V dopant like arsenic (As) or phosphorous (P) for n-type conductivity or a Group III dopant like boron (B) for p-type conductivity, into the semiconductor material of the device layer 12. The device structures 40 may include other elements such as halo regions, lightly doped drain (LDD) extension regions, etc. Non-conductive spacers 48 may be formed on the vertical sidewalls of the gate electrodes 42.

Device structure 36 has a composite gate dielectric 37 that includes the base dielectric layer 22, the nitrogen-enriched layer 24, the section 29 of dielectric material, and the section 31 of dielectric material. The gate dielectric 37 of device structure 36 is a comparatively thick gate dielectric with a nitrided region that may be appropriate for a low on-resistance (Ron) field-effect transistor used in, for example, a switch. The reduction in Ron may be achieved while maintaining a high junction breakdown and low leakage current by forming multiple nitride interfaces represented by the nitrogen-enriched layers 24, 26. One of the nitrided interfaces is located between the gate dielectric 37 and the silicon body provided by the associated section of the device layer 12, and the BOX layer 14 and the other nitrided interface is located between the silicon body and the BOX layer 14.

Device structures 38 and 40 have non-nitrided gate dielectrics, in contrast to the nitrided gate dielectric 37 of device structure 36. Device structure 38 has a gate dielectric 39 that includes the dielectric layer 28 and the section 31 of dielectric material. Device structure 38, in which the gate dielectric 39 is also a thick gate dielectric but lacks the nitrogen-enriched layer 24, may be appropriate for the construction of, for example, p-type field effect transistors in body region 21. Device structure 40 has a gate dielectric 41 that includes a patterned section of the dielectric layer 30. Device structure 40, which includes a comparatively thin gate dielectric that lacks the nitrogen-enriched layer 24, may be appropriate, for example, to fabricate field-effect transistors used in low-voltage logic. The gate electrode 42 and the underlying gate dielectrics 37, 39, 41 of the different device structures 36, 38, 40 may be formed by depositing a layer of the material forming the gate electrodes 42 on the different gate layers and patterning the respective gate electrode 42 and underlying gate layer with photolithography and etching. The nitrogen-enriched layer 26 is retained in the body regions 21, 23 in which the device structures 38, 40 are formed.

Device structure 36, which has a nitrided gate dielectric, may be a field-effect transistor used in a switch, such as a switch for an RF application. Device structures 38 and 40, which have non-nitrided gate dielectrics, may be used for other types of applications (e.g., p-type field effect transistors with a thick gate dielectric or low-voltage logic) associated with field-effect transistors. Device structures 38 and 40 are located in different body regions 21, 23 of the device layer 12 that the body region 19 of device structure 36.

Silicidation, middle-of-line (MOL), and back-end-of-line (BEOL) processing follows, which includes formation of contacts and wiring for a local interconnect structure, and formation of dielectric layers, via plugs, and wiring for an interconnect structure coupled by the interconnect wiring with the device structures 36, 38, 40.

Nitridation of a dielectric material in general and, in particular, the nitridation of an oxide has multiple benefits and effects. The threshold voltage of a field effect transistor at a fixed leakage current may be lowered due to the positive fixed charge and higher dielectric constant. The parasitic npn breakdown voltage of a field effect transistor may be reduced by reducing dopant segregation from a well (e.g., boron segregation from a p-well) to the BOX layer. The link resistance for a p-type field-effect transistor may be reduced by reducing dopant (e.g., boron) segregation from an extension region of the field-effect transistor to the BOX layer. The STI pulldown during the pre-clean occurring prior to silicidation and middle-of-line processing may be reduced, which may prevent leakage current due to the presence of silicide under the body and gate electrode. Nitridation of a dielectric material (e.g., oxide nitridation) may also reduce the penetration of dopant (e.g., boron) from post-gate implants that tend to counter-dope the well region for the case of p-type field-effect transistors.

Figure 6:
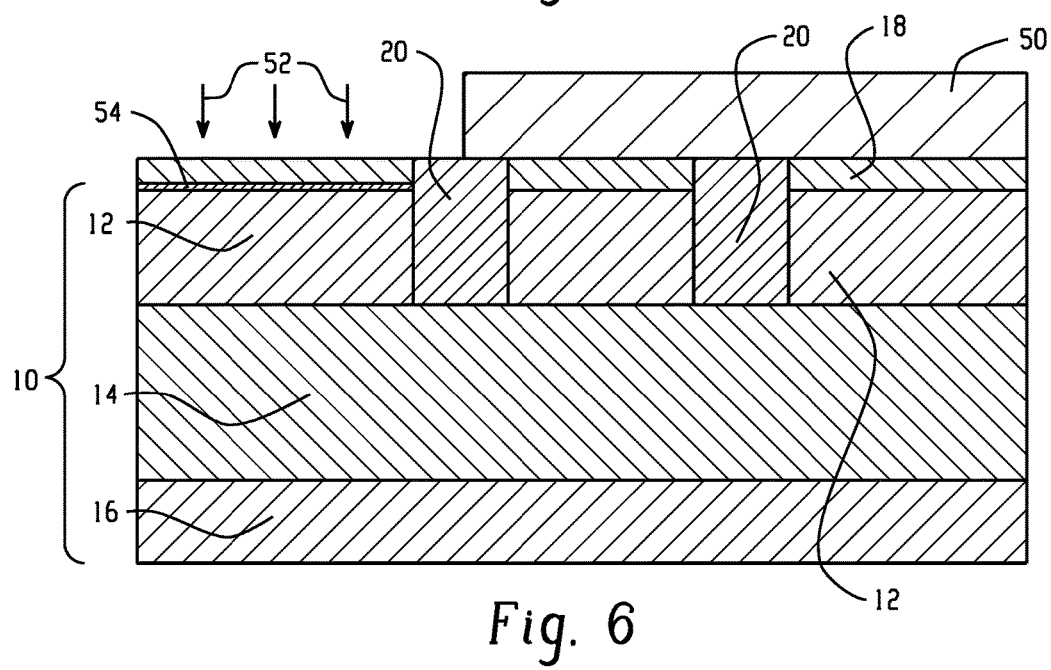
FIGS. 6-8 are cross-sectional views of a portion of a substrate at successive stages of a fabrication process in accordance with embodiments of the invention.

With reference to FIG. 6 in which like reference numerals refer to like features in FIG. 1 and in accordance with alternative embodiments, an implantation mask 50 is formed on the top surface of the screen oxide layer 18. The implantation mask 50 may comprise a photoresist that is applied as a coating by a spin coating process, pre-baked, exposed to light projected through a photomask, baked after exposure, and developed with a chemical developer to form an opening that exposes body region 19 while masking body regions 21 and 23. At the location of the opening in the implantation mask 50, nitrogen-containing ions 52 are introduced by ion implantation with selected implantation conditions into the screen oxide layer 18 on the device layer 12 in body region 19. A nitrogen-enriched layer 54 is formed with a depth profile that includes a peak dose (i.e., peak concentration) that is proximate to the interface between the screen oxide layer 18 and the device layer 12. The nitrogen-enriched layer 54 is at least partially, and preferably completely, located in the device layer 12 beneath the screen oxide layer 18.

The ions 52 used to form the nitrogen-enriched layer 54 may be generated from a suitable source gas containing nitrogen and implanted using an ion implantation tool. The implantation conditions (e.g., ion species, dose, kinetic energy, angle of incidence) are selected to deliver the ions with a given concentration profile at the locations defined by the opening in the implantation mask 50. The nitrogen-containing ions are stopped by the implantation mask 50 so that the masked body regions 21 and 23 are not implanted. The peak dose of nitrogen may be greater than $5 \times 10^{11}$ atoms per square centimeter (atoms/cm$^2$) that is believed to be effective to lower the On-resistance (Ron) in view of the effectiveness of such ion doses to reduce negative-bias temperature instability (NBTI) degradation of p-type field-effect transistors.

Figure 7:
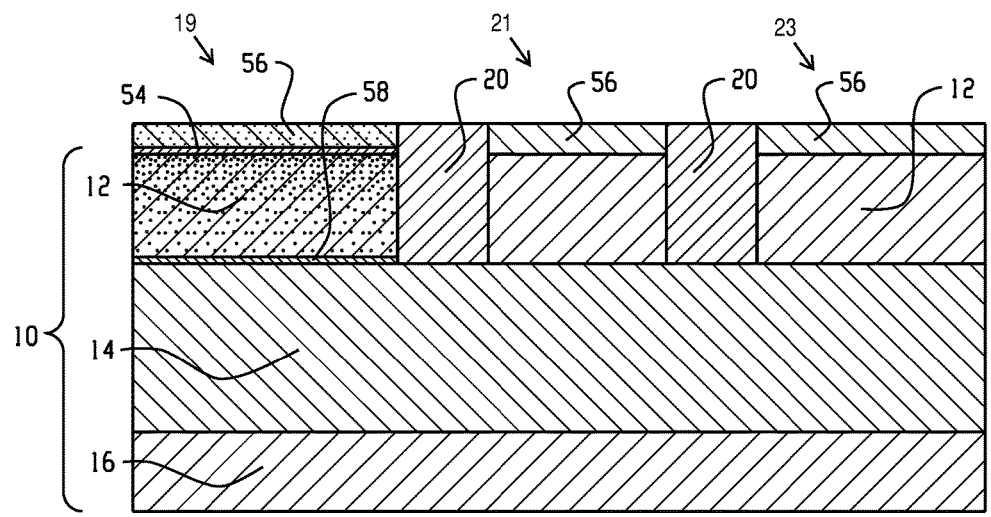

With reference to FIG. 7 in which like reference numerals refer to like features in FIG. 6 and at a subsequent fabrication stage, the screen oxide layer 18 is removed from the device layer 12 in all of the body regions 19, 21, 23. The nitrogen-enriched layer 54 is retained in the device layer 12 when the screen oxide layer 18 is removed. In an embodiment, the entirety of the nitrogen-enriched layer 54 may be retained when the screen oxide layer 18 is removed.

A base dielectric layer 56 is formed on the top surface of the device layer 12 in body regions 19, 21, 23. The base dielectric layer 56 may be composed of a dielectric material, such as silicon dioxide (SiO$_2$) grown by oxidizing the top surface of device layer 12 or deposited by CVD. The nitrogen-enriched layer 54 is located at the interface 25 between the device layer 12 and the base dielectric layer 56.

Nitrogen diffuses vertically from the nitrogen-enriched layer 54 into the base dielectric layer 56 and also into the device layer 12 in body region 19 due to temperature-driven diffusion associated with the growth of the base dielectric layer 56. The base dielectric layer 56 in the body region 19 is nitrided by the diffused nitrogen content. The device layer 12 in body region 19 may include a nitrogen content between the nitrogen-enriched layer 54 and the nitrogen-enriched layer 58 that is graded in concentration. In an embodiment, the graded nitrogen concentration in the device layer 12 may decrease with increasing distance in a direction from the nitrogen-enriched layer 54 at the interface 25 toward interface 15 such that a maximum nitrogen concentration in the gradient is located in the device layer 12 near the interface 25 and a minimum nitrogen concentration in the gradient is located in the device layer 12 near the interface 15. A nitrogen-enriched layer 58 with a peak nitrogen concentration forms at the interface 15 between the device layer 12 and the BOX layer 14 in body region 19 due to accumulation, during diffusion, at the interface 15. The nitrogen-enriched layer 58 may be located in total or in part in the device layer 12 at the interface 15 and/or in total or in part in the BOX layer 14 at the interface 15. Lateral nitrogen diffusion is blocked by the intervening trench isolation regions 20 such that the body regions 21 and 23 do not include either of the nitrogen-enriched layers 54, 58.

Figure 8:
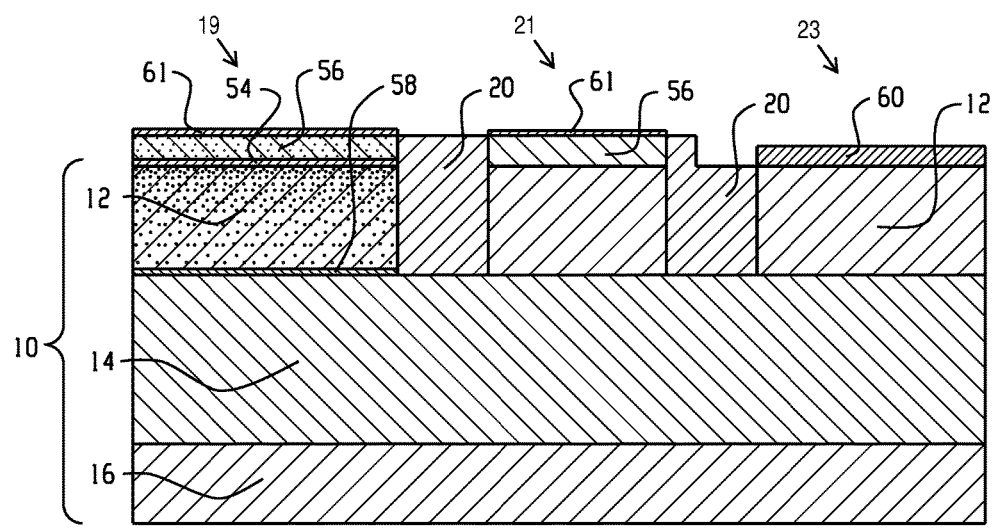

With reference to FIG. 8 in which like reference numerals refer to like features in FIG. 7 and at a subsequent fabrication stage, the base dielectric layer 56 is removed from the top surface of the device layer 12 in body region 23. A photoresist layer (not shown) may be applied, lithographically patterned, and then used as an etch mask in for an isotropic etch using, for example, a wet chemical solution containing hydrofluoric acid (HF), that removes the dielectric material of the base dielectric layer 56 selective to the semiconductor material of the device layer 12 in body region 23. The etch mask is stripped after removal of the base dielectric layer 56 from body region 23.

A dielectric layer 60 is formed on the top surface of the device layer 12 in body region 23 from which the base dielectric layer 56 was removed. The dielectric layer 60 may be composed of an electrical insulator, such as silicon dioxide ($SiO_2$) deposited by CVD. In an embodiment, the dielectric layers 56, 60 may be composed of the same dielectric material, and the dielectric layer 60 may have a thickness that is less than the thickness of the base dielectric layer 56.

Sections 61 of the dielectric material of dielectric layer 60 also form on the top surface of the base dielectric layer 56 in body region 21, and on the top surface of the nitrided base dielectric layer 56 above the nitrogen-enriched layer 54 in body region 19. An oxidation process at a temperature of, for example, 900° C. may follow in order to improve the dielectric properties of these sections 61 of dielectric material.

The process continues as described in the context of FIG. 5 to form device structures 36, 38, 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first dielectric layer on a semiconductor layer;
   nitriding the first dielectric layer;
   forming a first nitrogen-enriched layer at a first interface between the first dielectric layer and the semiconductor layer; and
   forming a second nitrogen-enriched layer at a second interface between the semiconductor layer and a second dielectric layer,
   wherein the second dielectric layer is separated from the first dielectric layer by the semiconductor layer.

2. The method of claim 1 wherein the semiconductor layer is a device layer of a silicon-on-insulator substrate, and the second dielectric layer is a buried oxide layer of the silicon-on-insulator substrate.

3. The method of claim 1 wherein the first nitrogen-enriched layer is formed when the first dielectric layer is nitrided.

4. The method of claim 3 wherein the second nitrogen-enriched layer is formed when the first dielectric layer is nitrided.

5. The method of claim 3 wherein nitriding the first dielectric layer comprises:
   heating the first dielectric layer with the first dielectric layer exposed to an atmosphere that includes a nitrogen-rich source gas,
   wherein the first nitrogen-enriched layer and the second nitrogen-enriched layer are formed by diffusion of nitrogen from the atmosphere into the first dielectric layer and the semiconductor layer and accumulation of the nitrogen at the first interface and the second interface.

6. The method of claim 5 wherein a temperature during heating ranges from 855° C. to 1150° C.

7. The method of claim 1 wherein the first nitrogen-enriched layer is formed before the first dielectric layer is formed.

8. The method of claim 7 wherein forming the first nitrogen-enriched layer at the first interface between the first dielectric layer and the semiconductor layer comprises:
   forming a screen oxide layer on the semiconductor layer; and
   forming the first nitrogen-enriched layer by implantation through the screen oxide layer.

9. The method of claim 8 further comprising:
   after first nitrogen-enriched layer is formed, removing the screen oxide layer,
   wherein the first interface is defined when the first dielectric layer is formed.

10. The method of claim 9 wherein the second nitrogen-enriched layer is formed by diffusion through the semiconductor layer to the second interface when the first dielectric layer is formed.

11. The method of claim 8 wherein the first dielectric layer is nitrided by diffusion from the first nitrogen-enriched layer when the first dielectric layer is formed.

12. The method of claim 11 wherein the semiconductor layer includes nitrogen in a graded concentration that originates from the first nitrogen-enriched layer, and the nitrogen in the graded concentration decreases with increasing distance from the first interface in a direction toward the second interface.

13. A method comprising:
forming a first dielectric layer on a semiconductor layer in a first body region and a second body region separated from the first body region by a trench isolation region;
forming a first nitrogen-enriched layer at a first interface between the first dielectric layer and the semiconductor layer in the first body region and between the first dielectric layer and the semiconductor layer in the second body region;
after the first nitrogen-enriched layer is formed, removing the first dielectric layer and the first nitrogen-enriched layer from the semiconductor layer in the second body region; and
forming a second dielectric layer on the semiconductor layer in the second body region, wherein the second dielectric layer is separated from the first dielectric layer by the semiconductor layer.

14. The method of claim 13 further comprising:
forming a second nitrogen-enriched layer at a second interface between the semiconductor layer and a second dielectric layer in the first body region and the second body region.

15. The method of claim 14 wherein the second nitrogen-enriched layer is retained at the second interface between the semiconductor layer and the second dielectric layer in the second body region when the first dielectric layer and the first nitrogen-enriched layer are removed from the semiconductor layer in the second body region.

16. The method of claim 14 wherein the first nitrogen-enriched layer and the second nitrogen-enriched layer are formed by heating the first dielectric layer with the first dielectric layer exposed to an atmosphere that includes a nitrogen-rich source gas, and the first nitrogen-enriched layer and the second nitrogen-enriched layer are formed by diffusion of nitrogen from the atmosphere into the first dielectric layer and the semiconductor layer and accumulation at the first interface and the second interface.

17. A device structure comprising:
a semiconductor layer including a first body region and a second body region;
a trench isolation region separating the first body region of the semiconductor layer from the second body region of the semiconductor layer;
a first field-effect transistor including a first dielectric layer formed on the semiconductor layer in the first body region;
a second field-effect transistor including a second dielectric layer formed on the semiconductor layer in the second body region; and
a first nitrogen-enriched layer at a first interface between the first dielectric layer and the semiconductor layer in the first body region,
wherein the first nitrogen-enriched layer is absent between the second dielectric layer and the semiconductor layer in the second body region.

18. The device structure of claim 17 wherein the semiconductor layer is a device layer of a silicon-on-insulator substrate, and further comprising:
a second nitrogen-enriched layer at a second interface between the semiconductor layer and a buried oxide layer of the silicon-on-insulator substrate in the first body region and in the second body region.

* * * * *